(12) United States Patent
Freeman et al.

(10) Patent No.: US 8,098,702 B1
(45) Date of Patent: Jan. 17, 2012

(54) STEP WELL QUANTUM CASCADE STRUCTURES

(75) Inventors: Will Freeman, Ridgecrest, CA (US); Gamani Karunasiri, Pacific Grove, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 16 days.

(21) Appl. No.: 12/555,597

(22) Filed: Sep. 8, 2009

Related U.S. Application Data

(60) Provisional application No. 61/095,553, filed on Sep. 9, 2008.

(51) Int. Cl.
*H01S 5/00* (2006.01)
(52) U.S. Cl. ............... 372/46.01; 372/43.01; 372/44.01
(58) Field of Classification Search .................. None
See application file for complete search history.

(56) References Cited

U.S. PATENT DOCUMENTS

| | | | | |
|---|---|---|---|---|
| 5,023,879 | A  * | 6/1991 | Wang et al. ................. | 372/43.01 |
| 5,509,025 | A  * | 4/1996 | Capasso et al. ........... | 372/45.012 |
| 6,819,696 | B1 * | 11/2004 | Belenky et al. ............ | 372/45.01 |
| 7,158,545 | B2 | 1/2007 | Hu et al. | |
| 2005/0058168 | A1 * | 3/2005 | Hu et al. ........................ | 372/44 |
| 2006/0039431 | A1 * | 2/2006 | Sekiguchi et al. .......... | 372/44.01 |
| 2007/0248131 | A1 * | 10/2007 | Botez et al. ................ | 372/43.01 |

* cited by examiner

*Primary Examiner* — Jessica Stultz
*Assistant Examiner* — Sean Hagan
(74) *Attorney, Agent, or Firm* — Christopher L. Blackburn

(57) ABSTRACT

A Quantum Cascade (QC) structure(s) for use in Quantum Cascade Lasers (QCLs) that use step quantum well(s) in which the radiative and LO-phonon transitions are both vertical transitions and within the same step well. This approach allows for a high oscillator strength and uses LO-phonon scattering for fast depopulation of the middle state (lower lasing state) for maintaining a population inversion. The step also reduces unwanted injection into the lower lasing state due to spatial separation of the wavefunctions. It is emphasized that this abstract is provided to comply with the rules requiring an abstract that will allow a searcher or other reader to quickly ascertain the subject matter of the technical disclosure. This Abstract is submitted with the understanding that it will not be used to interpret or limit the scope of the claims.

9 Claims, 7 Drawing Sheets

STEP WELL QUANTUM CASCADE STRUCTURES

CROSS REFERENCE TO RELATED APPLICATION

This application claims priority to the prior filed U.S. provisional application having Application Number 61095553, filed on Sep. 9, 2008.

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefore.

FIELD OF THE INVENTION

The invention relates to step well quantum cascade (QC) structures for use in quantum cascade lasers (QCLs).

BACKGROUND OF THE INVENTION

Conventional quantum cascade lasers (QCLs) have used square (symmetric when not under an applied bias) quantum wells. At least in part because conventional QCLs use square quantum wells, it is not possible in conventional QCLs to place both the radiative and LO-phonon transitions within one single quantum well when the radiative transition energy spacing is smaller than the LO-phonon energy spacing (as can be for terahertz QCLs).

The first QCL was a mid infrared laser that used LO-phonon scattering for depopulation; however, the diagonal transitions that were used for both the phonon and radiative transitions are generally not well suited for terahertz applications (J. Faist, F. Capasso, D. L. Sivco, C. Sirtori, A. L. Hutchinson, and A. Y. Cho, Science, 264:553 (1994)).

Other conventional square four quantum well and three quantum well LO-phonon terahertz QCLs have been developed. They use at least two quantum wells for the radiative transition and a third quantum well which uses two energy levels; one energy level is used to resonantly tunnel the lower lasing state and the other arranges the lower state, approximately spaced at the LO-phonon energy. While these configurations can have vertical transitions, they use more than one quantum well for the radiative transition, and due to the use of resonant tunneling of the lower lasing state, the lower lasing state always has a doublet of states (for example, see quantum states $E_4$ and $E_3$ in FIG. 5 of U.S. Pat. No. 7,158,545 to Qing Hu, et al.). This doublet of states can provide a mechanism of absorption loss of terahertz radiation in the lower frequency of operation limit. (Q. Hu and B. S. Williams, "Terahertz Lasers and Amplifiers Based on Resonant Optical Phonon Scattering to Achieve Population Inversion," U.S. Pat. No. 7,158,545, Filed Sep. 12, 2003, issued Jan. 2, 2007) (H. Lou, S. R. Laframboise, Z. R. Wasilewski, G. C. Aers, and H. C. Liu, Appl. Phys. Lett, 90, 04112 (2007)). Also, oscillator strengths typically range from ~0.5 to less than 1.

Conventional LO-phonon QCL configurations can experience unwanted parasitic injection into the lower lasing state. Attempts to reduce that unwanted parasitic injection have been made by adding an additional well at the injector, but the oscillator strength was reduced with this type of approach (S. Kumar, B. S. Williams, J. L. Reno, Appl. Phys. Lett. 88:121123 (2006)).

Miniband approaches, such as the bound to continuum approach that features minibands and a somewhat isolated radiative state (G. Scalari, L. Ajili, J. Faist, H. Beere, E. Linfield, D. Ritchie, and G. Davies, Appl. Phys. Lett. 82:3165 (2003)) as well as hybrid miniband configurations with optical-phonon scattering (G. Scalari, N. Hoyler, M. Giovannini, and J. Faist, Appl. Phys. Lett. 86:181101 (2005)), have also been pursued. Oscillator strengths for miniband configurations are sometimes listed higher than their LO-phonon configuration counterparts; however, this is somewhat offset since their section lengths are about twice as long as compared to LO-phonon configurations. Miniband configurations can also be more susceptible to thermal back filling.

The importance of improving the injector efficiency can be seen by the following approximate 2D population inversion relation:

$$\Delta n_{2D} = \eta \frac{J}{e} \tau_2 \left(1 - \frac{\tau_1}{\tau_{21}}\right) - (1-\eta)\frac{J}{e}\tau_1$$

where $\eta$ is the injection efficiency, $e=1.602\ 176\ 53(14) \times 10^{-19}$ Coul., J is the current density, $\Delta n_{2D}$ is the 2D population inversion, and the state lifetimes are represented by $\tau$. The population inversion can be improved by increasing the injection efficiency, having a long upper state lifetime, and by having $\tau_1 \ll \tau_{21}$.

Figure 1:
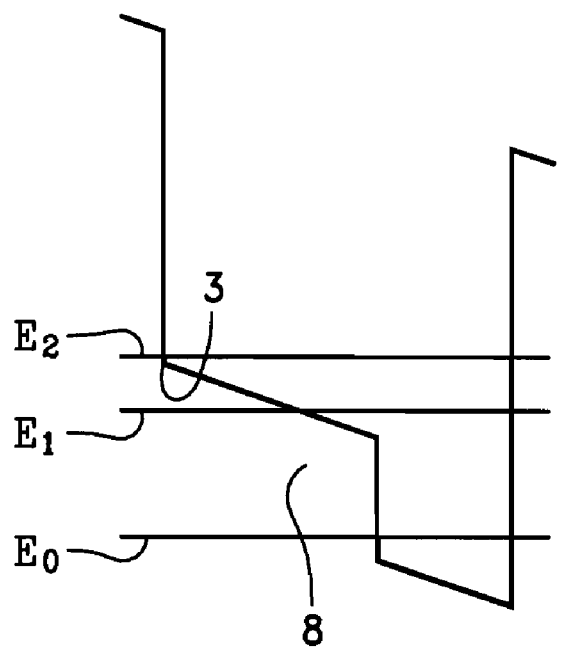
FIG. 1 of the drawings is a conduction band profile of one embodiment of a step well.

It is to be understood that the foregoing and the following description are exemplary and explanatory only and are not to be viewed as being restrictive of the invention, as claimed.

DESCRIPTION

Before beginning with the description of some of the embodiments, it is noted that, for illustrative purposes, a Type I bandgap alignment (where the barrier heights in the conduction band are controlled by the material bandgap) is assumed in this specification, including the claims, and drawings.

The term "quantum well" is known in the art. As used herein, consistently with the usage in the art, a "quantum well", formed in the conduction band of a semiconductor construct, refers to a planar semiconductor region sandwiched between two planar semiconductor regions (typically referred to as barrier layers) having a different bandgap, where the bandgap of the sandwiched region is smaller than the bandgaps of the barrier layers (for square wells the barrier layers usually have the same bandgap). The spacing between the barrier layers, and consequently the thickness of the quantum well layer (the quantum well layer is the "sandwiched region"), is selected such that charge carriers residing in the quantum well layer exhibit quantum effects.

The term "step quantum well" (referred to in this specification including the claims as "step well"), formed in the conduction band of a semiconductor construct, as used herein, describes a planar semiconductor region, having at least two semiconductor layers sandwiched between two planar semiconductor regions (barrier layers), where: 1) each of the at least two semiconductor layers comprising the sandwiched semiconductor region having a bandgap that is different than the bandgap of at least one of the other at least two semiconductor layers in the sandwiched semiconductor region; and 2) each of the at least two semiconductor layers comprising the sandwiched region having a bandgap that is smaller than the bandgap of the barrier layers (which often have the same bandgap). Any sandwiched semiconductor layer having a bandgap greater than the bandgap of the sandwiched semiconductor layer having the smallest bandgap is considered to be a "step".

A Quantum Cascade (QC) structure constructed in accordance with the principles of the invention includes an active lasing region generally formed as a semiconductor heterostructure having a plurality of cascaded nominally identical lasing sections, which are functionally associated in series. The number of the lasing sections is typically about 200 sections.

In some embodiments, the heterostructure of at least one lasing section of an embodiment of a terahertz QC structure includes at least one quantum well, where at least one of the at least one quantum wells is a step well capable of forming at least three states (upper, middle, and lower). Note that in some embodiments employing a step well injector, it is possible that less than three states are formed within the step well. The heterostructure of some embodiments of a terahertz QC structure has only one quantum well per lasing section when that one quantum well is a step well.

Figure 5:
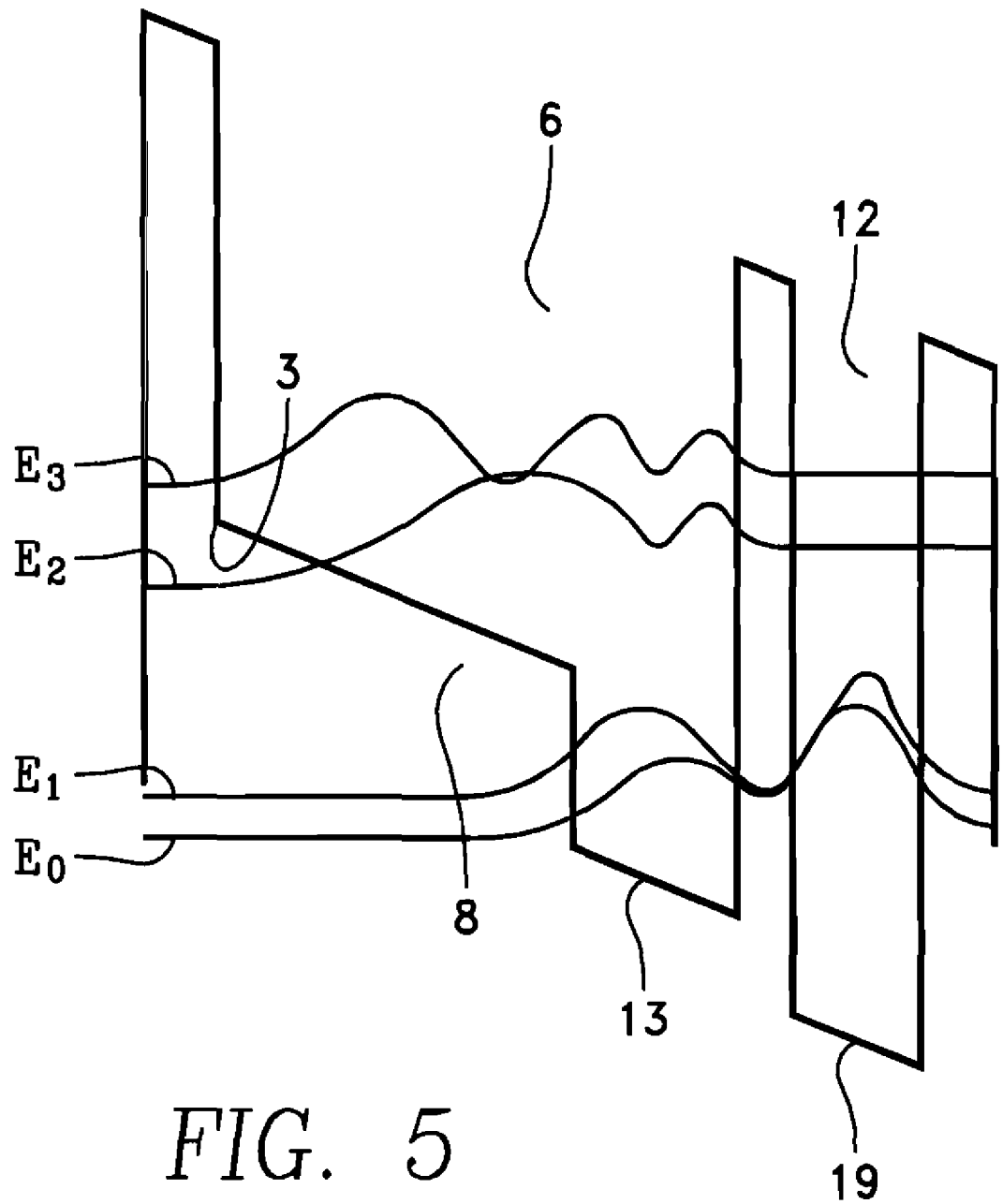
FIG. 5 of the drawings is a conduction band profile of one lasing section of one embodiment of a step well QC structure having a step well (having a single step) and a one well injector where the step well and injector well troughs are different heights.
Figure 6:
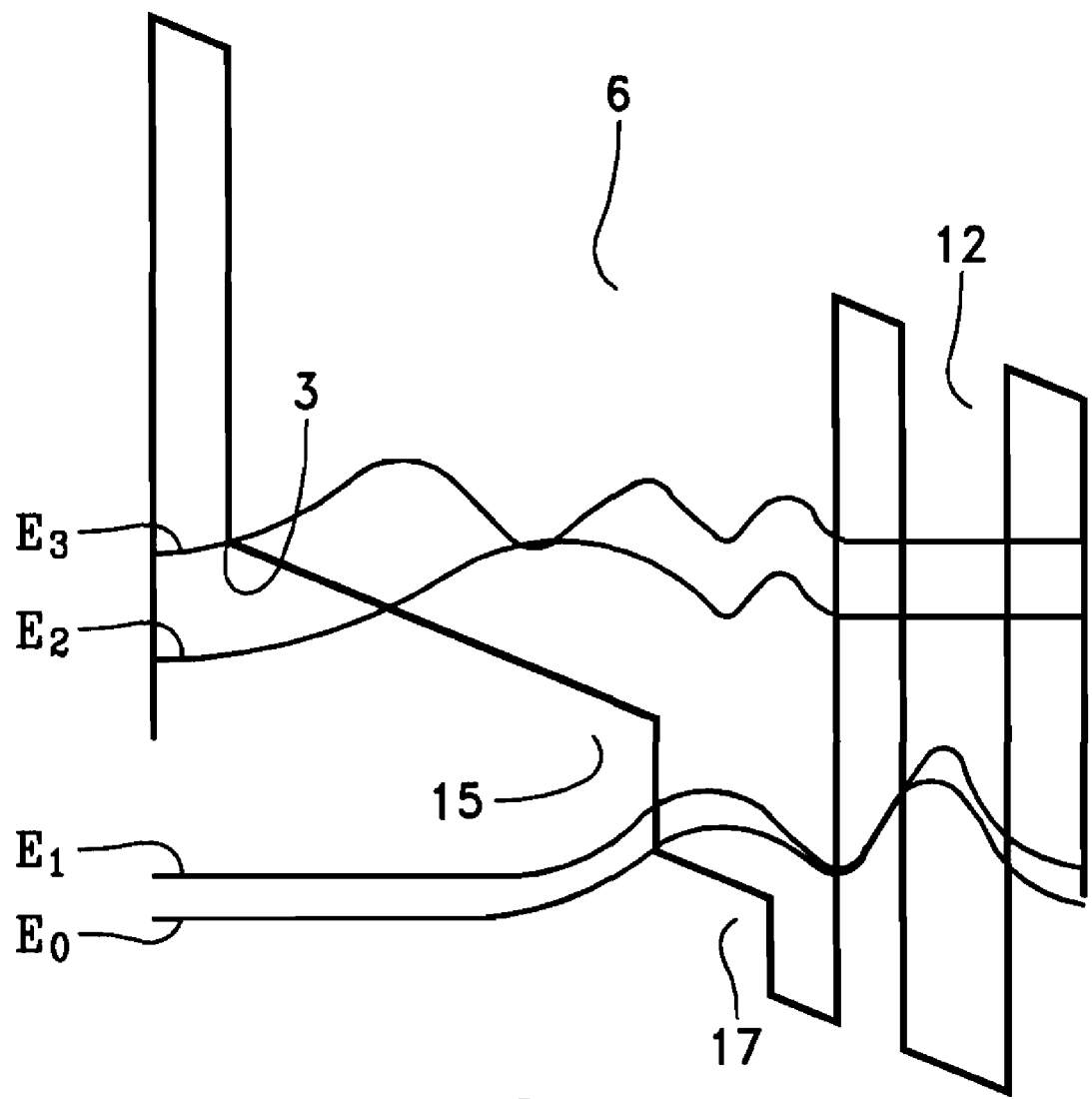
FIG. 6 of the drawings is a conduction band profile of one lasing section of one embodiment of a step well QC structure having a step well (having two different height steps) and a single well injector.
Figure 8:
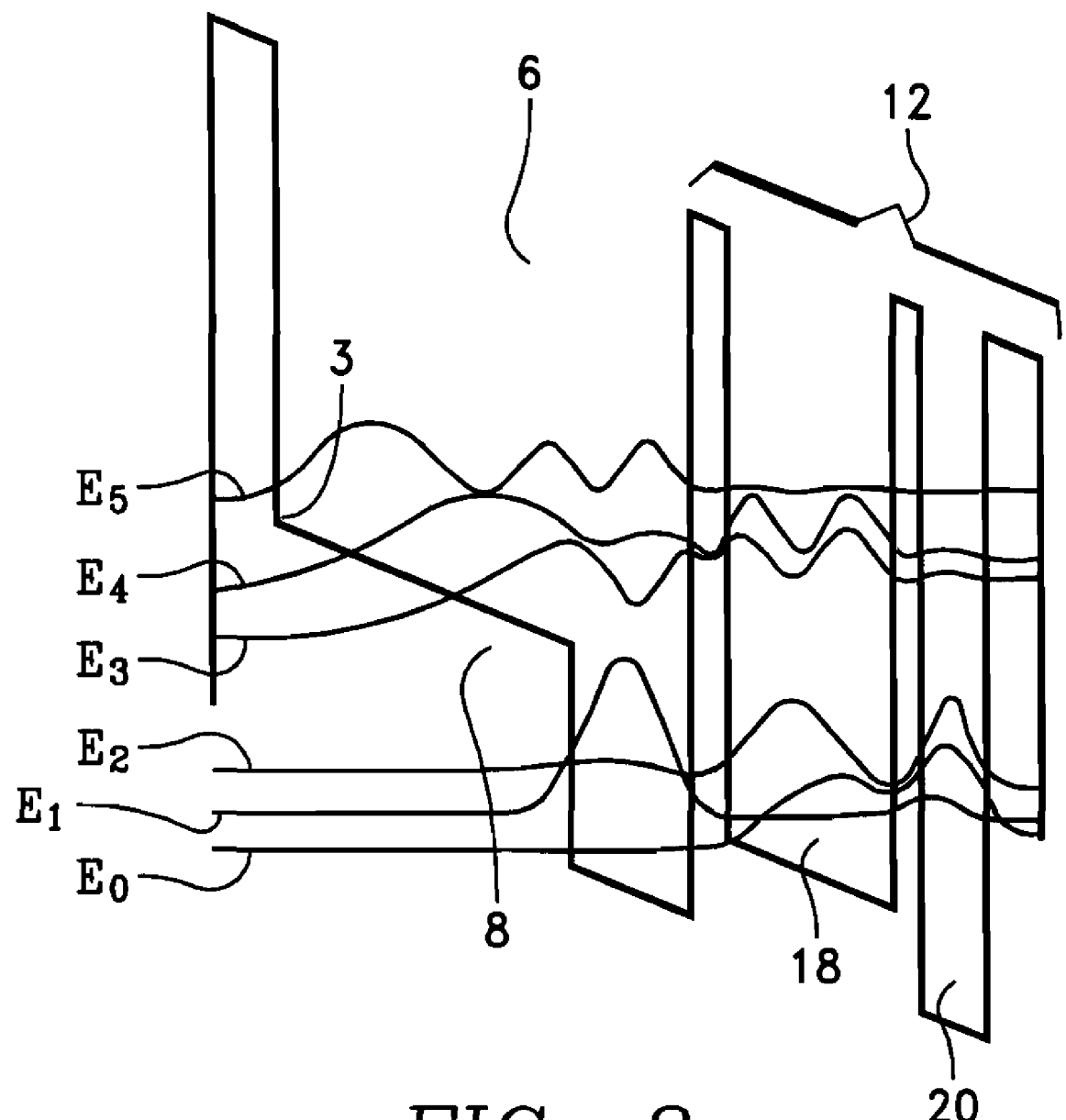
FIG. 8 of the drawings is a conduction band profile of one lasing section of one embodiment of a step well QC structure having a step well (having a single step) and a two well injector that allows resonant tunneling of the lower lasing state, and the lower state(s).

An exemplary embodiment of a step well in a QC structure is formed as an $Al_xGa_{1-x}As$ heterostructure, where at least two Al compositions are used. However, in other embodiments, a step well in a QC structure is formed using more than two Al compositions, as shown in the embodiments of FIGS. 5, 6, and 8. An $Al_xGa_{1-x}As$ heterostructure is an exemplary material that may be used to grow the step well(s) in a QC structure. The step well(s) in a QC structure may also be grown using suitable semiconductor materials known to one skilled in the art other than $Al_xGa_{1-x}As$. The lasing sections are doped in the usual method; generally one of the barriers or wells is doped or center delta doped.

The active region may be formed into a waveguide by any known means. Two commonly used waveguide approaches are the metal-metal and surface-plasmon waveguides. The facets of the waveguide and resonator can be coated with a high reflectivity coating or left uncoated. The laser is formed by growing N sections and processing the sample into a waveguide/resonator. Typically, the active region thickness is on the order of about 10 μm and guide widths are on the order of about 50 to about 200 μm, depending on the type of waveguide used.

Considering the surface plasmon waveguide first, the side contacts spacing is generally set to about 50 nm to keep the mode from coupling to avoid higher waveguide loss. In order to have ohmic contacts, the top contact layers are generally doped (for example about 60 nm thick and doped at $5\times10^{18}$ $cm^{-3}$). The optimal lower plasma layer thickness can be determined by computing the threshold gain=$(\alpha_m+\alpha_w)\Gamma$, where $$\alpha_m = -1/2 \ln(R_1 R_2) \text{ is the mirror loss, with } R_1 \text{ and } R_2 \text{ being the intensity reflectivity,} \quad (1)$$

$\alpha_w$ is the waveguide loss,
$\Gamma$ is the confinement factor,
as a function of plasma layer thickness for different doping concentrations and mirror losses (to corresponding resonator lengths).

For a metal-metal waveguide configuration, the top and lower contact layers can be doped to generate ohmic contacts, for example about 60 nm thick (10 and 50 nm layers doped at $5\times10^{19}$ and $5\times10^{18}$ $cm^{-3}$, and the lower contact may also use a LTG GaAs layer). For the metal-metal waveguides, the threshold gains are often less than the surface plasmon guides, with the confinement factors, $\Gamma$, is equal to about 1, but generally have lower output coupling factors $$\alpha_m/(\alpha_m+\alpha_w)). \quad (2)$$

Although the figures illustrate no more than two lasing sections, those having ordinary skill in the art will appreciate that the exemplary illustrations are applicable to other lasing sections in the active region. Further, though certain conduction band heights and energy states (or levels) are illustrated, the illustrated conduction band heights and energy levels were selected for exemplary purposes, and those having ordinary skill in the art will appreciate that the conduction band heights and energy levels of a step quantum well QC structure can vary in accordance with the principles of the invention.

FIG. 1 of the drawings illustrates an exemplary conduction band profile of one possible embodiment of part of a lasing section of a terahertz LO-phonon step well QC structure having a quantum well structure having only a single quantum well—the single quantum well being a step well. In FIG. 1, three states, ($E_0$ (lower state), $E_1$ ('middle state' or 'lower lasing state'), and $E_2$ ('upper lasing state')) are formed, (in the presence of an applied electric field), in which the energy spacing between $E_2$ and $E_1$ (which are spaced at the radiative energy spacing) is smaller than the energy spacing between $E_1$ and $E_0$ (which are spaced at or near the resonant LO-phonon energy spacing); the upper lasing state, $E_2$, is located near or above the highest point 3 of the only (therefore the first) step 8, and the lower lasing state, $E_1$, is located below the upper lasing state, $E_2$, and below the highest point 3 of the step 8.

Figure 2:
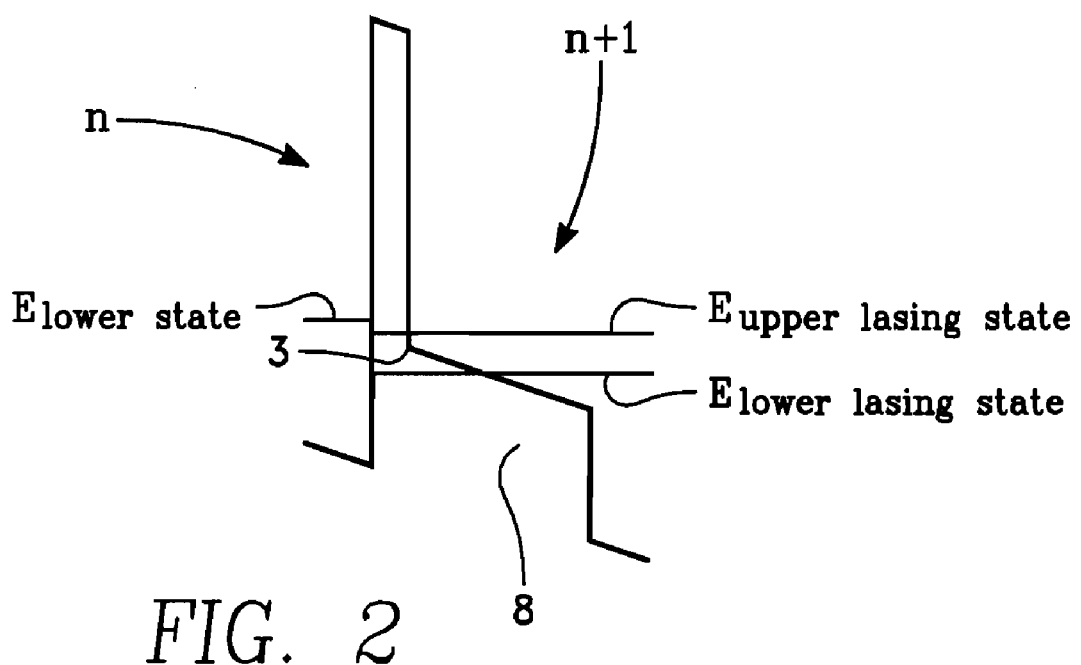
FIG. 2 of the drawings illustrates one embodiment of a step injector.

FIG. 2 of the drawings illustrates an exemplary embodiment of a step injector having a single conduction band height step; a step injector (as is illustrated as being located within a step well structure in FIGS. 3, 4, 5, 6, 7, and 8) having multiple equal conduction band height steps and/or multiple different conduction band height steps can be used/constructed in accordance with the principles of the invention. For simplicity, a step injector having a single conduction band height step (FIG. 2) is discussed. A step injector can be used in a QCL having a semiconductor heterostructure having a first lasing section (n) functionally coupled in series with a second lasing section (n+1), wherein each of the first lasing section (n) and second lasing sections (n+1) has a quantum well. A quantum well within each of the first and the second lasing sections is a step well. The step well has at least one step 8. The step well has, in the presence of an applied electric field, an upper lasing state, $E_{upper\ lasing\ state}$, and a lower lasing state, $E_{lower\ lasing\ state}$. A previous lasing section's lower state is shown as $E_{lower\ state}$), wherein the upper lasing state, $E_{upper\ lasing\ states}$ is located near or above the highest point 3 of the first of the at least one step 8, (FIG. 2 illustrates a step injector having a step well having only a single conduction band height step 8; therefore, in FIG. 2, the single step 8 is the first step), and the lower lasing state, $E_{lower\ lasing\ state}$, is located below the upper lasing state, $E_{upper\ lasing\ state}$, and below the highest point 3 of the first of the at least one step 8; the spatial separation of the wavefunctions of the upper lasing state, $E_{upper\ lasing\ state}$ lasing state, of the second lasing section and the lower state, $E_{lower\ state}$, of the first lasing section is less than the spatial separation of the wavefunctions of the lower lasing state, $E_{lower\ lasing\ state}$, of the second lasing section and the lower state, $E_{lower\ state}$, of the first lasing section, n, such that the overlap of the wavefunctions of the upper lasing state E upper lasing states of the second lasing section, n+1, and the lower state, $F_{lower\ state}$, of the first lasing section, n, is greater than the overlap of the wavefunctions of the lower lasing state, $E_{upper\ lasing\ state}$, of the second lasing section, n+1, and the lower state, $E_{upper\ lasing\ state}$, of the first lasing section, n.

Figure 3:
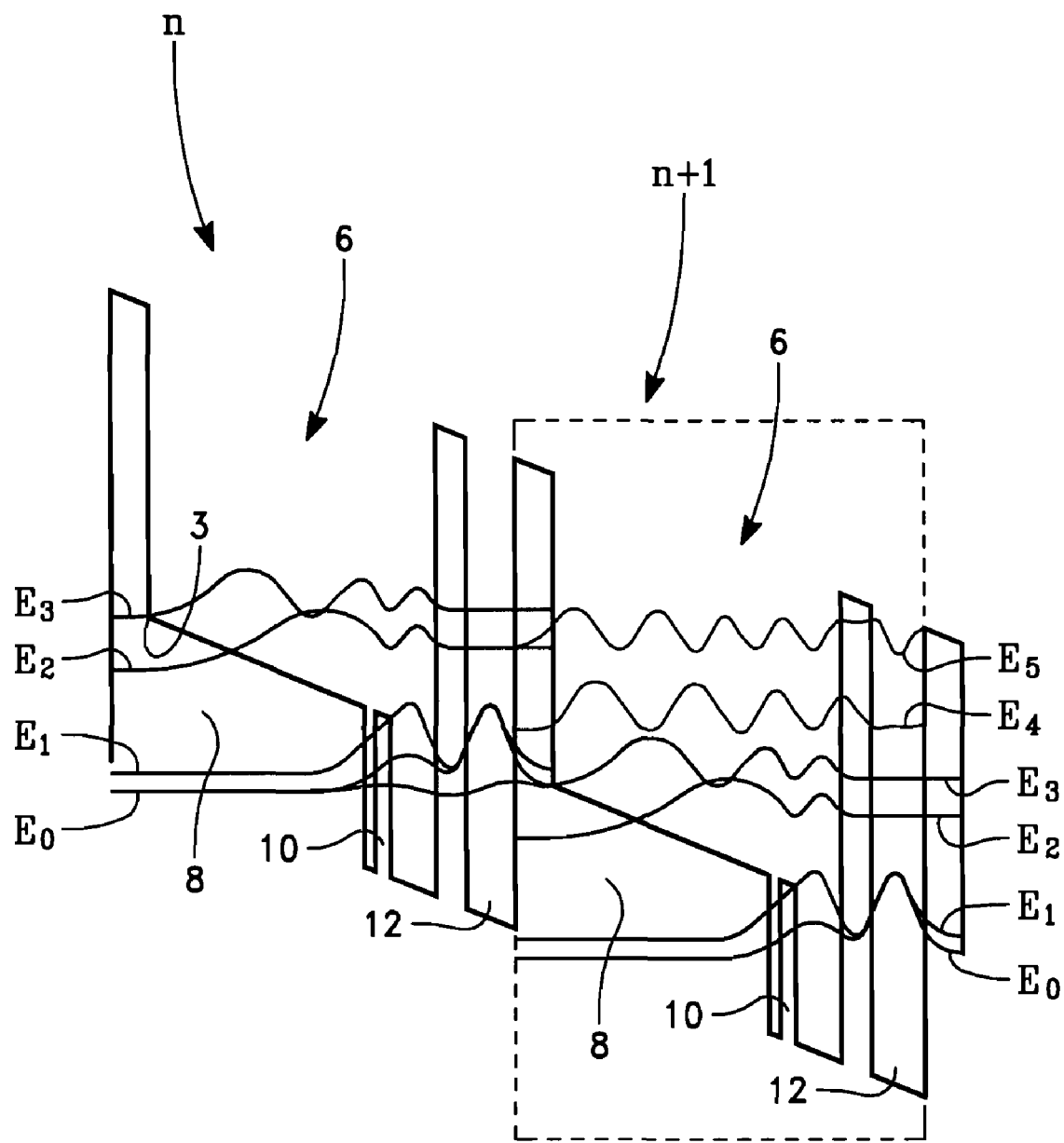
FIG. 3 of the drawings is a conduction band profile of two lasing sections of one embodiment of a step well quantum QC structure with each lasing section having a single well injector and a step having two equal height steps.

FIG. 3 shows an exemplary conduction band profile of two lasing sections—n and n+1—of an exemplary N lasing section cascade with one lasing section n+1 outlined (where typically N 185 sections). This conduction band profile depicts the energy levels of the two adjacent lasing sections—n and n+1—upon application of an applied electric field. For example, the lasing section n, which has a step well 6, with two equal conduction band height steps (8, 10) (assuming using a $Al_xGa_{1-x}As$ heterostructure), and a single well injector 12, includes quantum energy states $E_0$, $E_1$, $E_2$, and $E_3$. $E_0$ and $E_1$ represent the lower states energy levels, and the wavefunction for this doublet of lower states is shown. $E_2$ represents the energy level of the lower lasing state, and the wavefunction for this state is shown. Note that in some embodiments of the invention the lower lasing state, $E_2$, is arranged as a single energy state; in other words, it can be arranged without forming a doublet of states. $E_3$, located near or above the highest point 3 of the first step 8 in the lasing section, represents the wavefunction of the upper lasing state. Likewise, the adjacent lasing section n+1 has a step well 6, with two equal conduction band height steps (8, 10) (assuming using a $Al_xGa_{1-x}As$ heterostructure), and a single well injector 12, and includes similar energy states, though shifted in energy due to the applied electric field. States $E_4$ and $E_5$ are principally not used states. Each energy state is characterized by a wavefunction whose modulus squared is indicative of the probability distribution of the electrons residing in that state. The conduction band profile can be found by solving Schrödinger's equation or by using a self consistent solution to Schrödinger's and Poisson's equations. FIG. 3 is shown under an applied electric field. Electrons are injected into the upper state, $E_3$, and the optical or radiative transition occurs between states $E_3$ and $E_2$. The LO-phonon assisted transition takes place from state $E_2$ to the lower state (doublet) $E_1$ and $E_0$ since $E_{21}$ is near $\hbar\omega_{LO}$. This ensures fast depopulation of state $E_2$ via LO-phonon scattering, with a scattering rate lifetime of about 0.5 psec. Mini-band scattering between the doublet lower state, $E_1$ and $E_0$, takes place, with injection into the upper lasing state, $E_3$, of the next adjacent section. For simplicity, to describe injection from one lasing section into another, we herein describe injection from lasing section n into lasing section n+1 as representative. A similar injection occurs in the remainder of the N lasing sections of the N lasing section step well QC structure. If we consider the injection of electrons from lasing section n into lasing section n+1, the step reduces unwanted injection into state $E_2$ of lasing section n+1 from the lower states $E_1$ and $E_0$ of lasing section n. Monte Carlo simulations, (taking into account electron-electron, LO-phonon, impurity, and interface roughness scattering), of these types of structures yields injection efficiencies of about 90% from the doublet states $E_1$ and $E_0$ of lasing section n to state $E_3$ of lasing section n+1. Since these are intrawell transitions, the scattering rates computed are relatively fast. The radiative transition is also an intrawell transition. One implementation of an embodiment of a step well quantum cascade laser illustrated in FIG. 3 is formed using $Al_xGa_{1-x}As$ layers having compositions that are, beginning with the left injector, 0.16/0.05/0/0.05/0/0.16/0, and having a thicknesses in nm of 4.6/27.9/1.8/2/6.3/4.7/6.8. In this implementation of an embodiment of a step well quantum cascade laser illustrated in FIG. 3, $E_{32}$=15.2 meV (~3.7 THz), $E_{21}$=37.9 meV, and the center 2 nm of the 6.8 nm well is doped to a sheet density of $3.4 \times 10^{10}$ cm$^{-2}$. There is reasonably good overlap of the wavefunctions which provides an oscillator strength=$2\hbar/m\omega|<f|d/dx|i>|^2$=0.94 at 9.9 kV/cm (53.6 mV/section), where $$\hbar = 6.582\ 119\ 15(56) \times 10^{-22}\ \text{MeV sec}, \quad (3)$$

m=electron effective mass,
ω=angular frequency,
f=the final state,
i=the initial state.

A simulation of this structure yields a peak gain=

$$2e^2\hbar^2\Delta n_{3D}/m^2\epsilon v\omega FWHM|<f|d/dx|i>|^2 \sim 87\ \text{cm}^{-1}, \text{ where} \quad (4)$$

$\hbar = 6.582\ 119\ 15(56) \times 10^{-22}$ MeV sec,
m=electron effective mass,
ω=angular frequency,
$\Delta n_{3D}$=3D population inversion,
e=$1.602\ 176\ 53(14) \times 10^{-19}$ Coul.,
v=velocity magnitude (speed of light in medium),
FWHM=full width half maximum,
ϵ=permittivity,
f=the final state,
i=the initial state.
(W. Freeman and G. Karunasiri, Proc. SPIE 7311, 73110V (2009).

Figure 4:
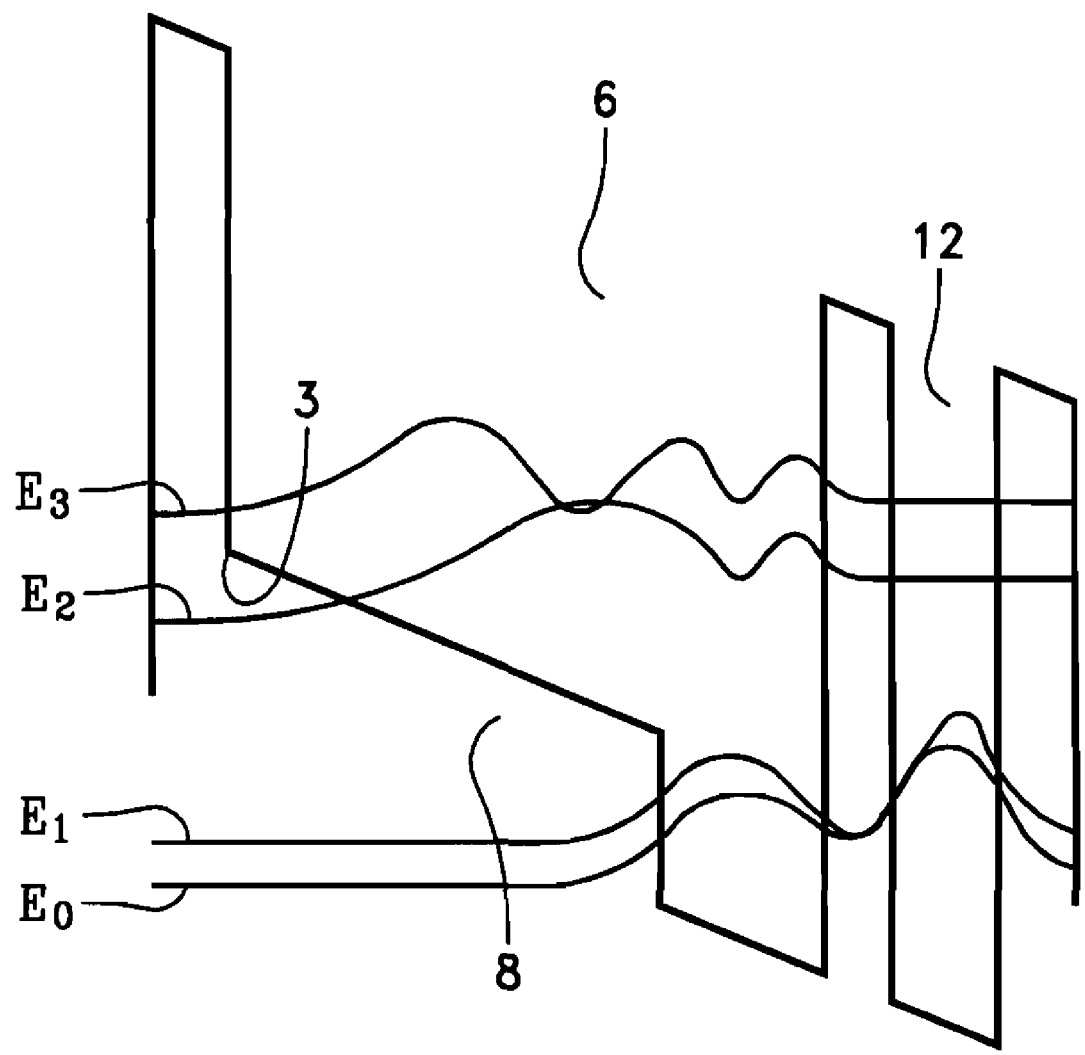
FIG. 4 of the drawings is a conduction band profile of one lasing section of one embodiment of a step well QC structure having a step well (having a single step) and a single well injector.

FIG. 4 shows an exemplary conduction band profile of one lasing section of one embodiment of a step well QC structure having a step well 6 (having a single step 8) and a one well injector 12. This embodiment includes, in the presence of an applied electric field, a doublet of lower states, $E_0$ and $E_1$, a lower lasing state $E_2$, located below the highest point 3 of the only step 8 in the step well 6, and below the upper lasing state $E_3$, which is located near or above the highest point 3 of the only step 8 in the step well 6.

FIG. 5 shows an exemplary conduction band profile of one lasing section of a step well QC structure having a step well 6 (having a single step 8) and a one well injector 12 where the step well 6 trough 13 and injector well 12 trough 19 have different conduction band heights. This embodiment includes, in the presence of an applied electric field, a doublet of lower states, $E_0$ and $E_1$, a lower lasing state $E_2$, located below the highest point 3 of the only step 8 in the step well 6, and below the upper lasing state $E_3$, which is located near or above the highest point 3 of the only step 8 in the step well 6.

FIG. 6 shows an exemplary conduction band profile of one lasing section of one embodiment of a step well QC structure having two different height steps (15, 17) and a one well injector 12. This embodiment includes, in the presence of an applied electric field, a doublet of lower states, $E_0$ and $E_1$, a lower lasing state $E_2$, located below the highest point 3 of the first step 15 in the step well 6, and below the upper lasing state $E_3$, which is located near or above the highest point 3 of the highest step 15 in the step well 6.

Figure 7:
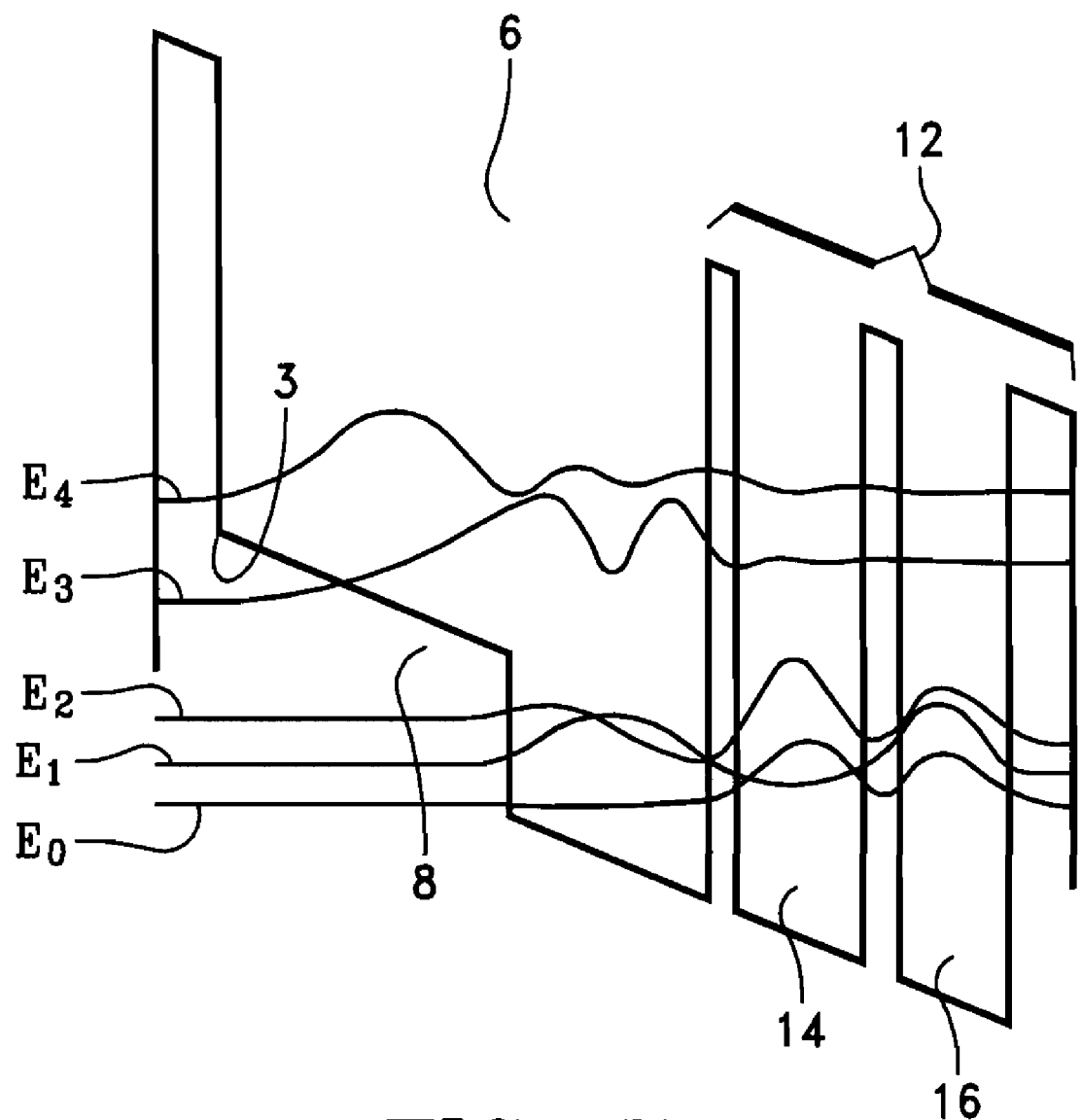
FIG. 7 of the drawings is a conduction band profile of one lasing section of one embodiment of a step well QC structure having a step well (having a single step) and a two well injector.

FIG. 7 shows an exemplary conduction band profile of one lasing section of one embodiment of a step well QC structure having a step well 6 (having a single step 8) and a two well (14, 16) injector 12. This embodiment includes, in the presence of an applied electric field, a triplet of lower states, $E_0$, $E_1$, $E_2$, a lower lasing state $E_3$, located below the highest point 3 of the only step 8 in the step well 6, and below the upper lasing state $E_4$, which is located near or above the highest point 3 of the only step 8 in the step well 6.

FIG. 8 shows an exemplary conduction band profile of one lasing section of one embodiment of a step well QC structure having a step well 6 (having a single step 8) and a two well injector 12. This embodiment includes, in the presence of an applied electric field, a triplet of lower states, $E_0$, $E_1$, $E_2$, a doublet lower lasing state $E_3$ and $E_4$, located near the highest point 3 of the only step 8 in the step well 6, and below the upper lasing state $E_5$, which is located near or above the highest point 3 of the only step 8 in the step well 6. The lasing section of this embodiment has a two well (18, 20) injector 12. This embodiment allows for resonant tunneling of the lower lasing state, and resonant tunneling/injection of the lower state(s).

While the invention has been described, disclosed, illustrated and shown in various terms of certain embodiments or modifications, the scope of the invention is not intended to be, nor should it be deemed to be, limited thereby and such other modifications or embodiments as may be suggested by the teachings herein are particularly reserved especially as they fall within the breadth and scope of the claims here appended.

What is claimed is:

1. A quantum cascade structure comprising:
a semiconductor heterostructure having a plurality of lasing sections functionally associated in series, each of said plurality of lasing sections having at least one quantum well;
at least one of said at least one quantum well of at least one of said plurality of lasing sections being a step well formed of lattice matched materials; and
said step well having, in the presence of an applied electric field, an upper lasing state, a lower lasing state, and a lower state, wherein said upper lasing state and said lower lasing state are separated by an energy corresponding to an optical frequency in a range from about 1 terahertz to about 5 terahertz, such that a radiative lasing transition between said upper lasing state and said lower lasing state is spatially vertical and occurs within said step well, wherein electrons populating said lower lasing state undergo non-radiative transition via resonant emission of a LO-phonon into said lower state of said step quantum well, and said resonant LO-phonon emission selectively depopulates the lower lasing state such that the lifetime of said upper lasing state is greater than the lifetime of said lower lasing state.

2. The quantum cascade structure of claim 1 wherein said lower lasing state is arranged as a single energy state.

3. A quantum cascade structure comprising:
a semiconductor heterostructure having a first lasing section functionally associated in series with a second lasing section, wherein each of said first and second lasing sections has at least one quantum well;
said at least one quantum well of each of said first and said second lasing sections being a step well formed of lattice matched materials;
said step well having at least one step; and
said step well having, in the presence of an applied electric field, an upper lasing state, a lower lasing state, wherein said upper lasing state is located at or above the highest point of the first of said at least one step in said step well, and said lower lasing state is located below said upper lasing state and below the highest point of the first of said at least one step in said step well, such that a spatial separation is such that the overlap of the wave functions of the upper lasing state of said second lasing section and a lower state of said first lasing section is greater than the overlap between the wave functions of the lower lasing state of said second lasing section and the lower state of said first lasing section; wherein said first lasing section does not have a step adjacent to a barrier separating said first lasing section and said second lasing section.

4. A quantum cascade structure comprising:
a semiconductor heterostructure having a plurality of lasing sections functionally associated in series, at least one of said plurality of lasing sections consisting of one quantum well, said quantum well being a step well; and
said step well having, in the presence of an applied electric field, an upper lasing state, a lower lasing state, and a lower state, wherein said upper lasing state and said lower lasing state are separated by an energy corresponding to an optical frequency in a range from about 1 terahertz to about 5 terahertz, such that a radiative lasing transition between said upper lasing state and said lower lasing state is spatially vertical and occurs within said step well, wherein electrons populating said lower lasing state undergo non-radiative transition via resonant emission of a LO-phonon into said lower state of said step quantum well, and said resonant LO-phonon emission selectively depopulates the lower lasing state such that the lifetime of said upper lasing state is greater than the lifetime of said lower lasing state.

5. The quantum cascade structure of claim 4 wherein each of said plurality of lasing sections consisting of one quantum well.

6. The quantum cascade structure of claim 4 wherein said step well having a plurality of steps.

7. The quantum cascade structure of claim 1 wherein said non-radiative transition is spatially vertical and occurs within said step well.

8. The quantum cascade structure of claim 7 wherein said lower lasing state is arranged as a single energy state.

9. An injector well comprising:
a semiconductor heterostructure having a first lasing section functionally associated in series with a second lasing section, wherein each of said first and second lasing sections has at least one quantum well;
said at least one quantum well of each of said first and said second lasing sections being a step well formed of lattice matched materials;
said step well having at least one step;
said step well having, in the presence of an applied electric field, an upper lasing state, a lower lasing state, wherein said upper lasing state is located at or above the highest point of the first of said at least one step in said step well, and said lower lasing state is located below said upper lasing state and below the highest point of the first of said at least one step in said step well, such that a spatial separation is such that the overlap of the wave functions of the upper lasing state of said second lasing section and a lower state of said first lasing section is greater than the overlap between the wave functions of the lower lasing state of said second lasing section and the lower state of said first lasing section; and at least one of said first lasing section and said second lasing section having an electron injector having no more than one barrier.

* * * * *